(12) United States Patent
Cox et al.

US009668368B2

(10) Patent No.: US 9,668,368 B2
(45) Date of Patent: May 30, 2017

(54) COLLAPSIBLE ENCLOSURE COVER FOR FACILITATING AIR FLOW FOR AN ENCLOSURE

(71) Applicant: International Business Machines Corporation, Armonk, NY (US)

(72) Inventors: Aaron R. Cox, Tucson, AZ (US); Camillo Sassano, Durham, NC (US); Joni E. Saylor, Phoenix, AZ (US); Kevin L. Schultz, Raleigh, NC (US)

(73) Assignee: International Business Machines Corporation, Armonk, NY (US)

( * ) Notice: Subject to any disclaimer, the term of this patent is extended or adjusted under 35 U.S.C. 154(b) by 455 days.

(21) Appl. No.: 14/277,900

(22) Filed: May 15, 2014

(65) Prior Publication Data
US 2015/0334872 A1 Nov. 19, 2015

(51) Int. Cl.
*H05K 5/03* (2006.01)
*H05K 7/20* (2006.01)
*H05K 5/02* (2006.01)

(52) U.S. Cl.
CPC .............. *H05K 5/03* (2013.01); *H05K 5/0217* (2013.01); *H05K 7/20145* (2013.01); *H05K 7/20745* (2013.01)

(58) Field of Classification Search
CPC .... H05K 5/03; H05K 5/0217; H05K 7/20745; H05K 7/20145; E04H 15/48
USPC .............. 135/147, 148, 152, 153; 52/63, 65; 361/690, 694, 695
See application file for complete search history.

(56) References Cited

U.S. PATENT DOCUMENTS

| 4,084,599 | A | * | 4/1978 | Matthews | E04H 4/108 135/132 |
| 4,716,919 | A | * | 1/1988 | Griffin | E04H 15/001 135/133 |
| 5,655,559 | A | * | 8/1997 | Zembik | E04H 15/38 135/132 |
| 5,918,615 | A | * | 7/1999 | Stuck, Sr. | E04H 15/38 135/117 |
| 6,145,525 | A | * | 11/2000 | Mooney | E04H 5/02 135/119 |
| 6,222,730 | B1 | * | 4/2001 | Korvenheimo | H04B 1/036 361/696 |
| 6,349,732 | B1 | * | 2/2002 | Cooper | E04H 6/005 135/116 |

(Continued)

FOREIGN PATENT DOCUMENTS

WO 2008122977 A2 10/2008

OTHER PUBLICATIONS

Accelerated Examination Support Document, U.S. Appl. No. 14/974,284, signed Dec. 15, 2015, 14 pgs.

(Continued)

*Primary Examiner* — Noah Chandler Hawk
(74) *Attorney, Agent, or Firm* — Nolan M. Lawrence

(57) ABSTRACT

A collapsible enclosure cover for facilitating air flow for an enclosure having a collapsible frame with a first guide rail having a mounting bracket and an elongated member. The collapsible frame also has a second guide rail having a mounting bracket and an elongated member. The collapsible frame also has a plurality of poles extending from the first guide rail to the second guide rail that swivel around the elongated members. The collapsible enclosure cover also has a fabric portion connected to and disposed over the plurality of poles.

9 Claims, 6 Drawing Sheets

(56) References Cited

U.S. PATENT DOCUMENTS

| | | | |
|---|---|---|---|
| 7,258,153 B2 | 8/2007 | Chen | |
| 7,534,167 B2* | 5/2009 | Day | H05K 7/20745 454/187 |
| 8,154,870 B1* | 4/2012 | Czamara | H05K 7/20736 361/694 |
| 8,371,322 B1* | 2/2013 | Wilson-Campbell | E04H 15/003 135/117 |
| 8,490,799 B2 | 7/2013 | Knight et al. | |
| 8,498,114 B2 | 7/2013 | Martini | |
| 8,640,395 B2* | 2/2014 | DiSabantonio, III | E04H 6/02 135/117 |
| 8,941,993 B2 | 1/2015 | Eckberg et al. | |
| 9,072,200 B2* | 6/2015 | Dersch | H05K 7/20745 |
| 2006/0260338 A1 | 11/2006 | VanGilder et al. | |
| 2012/0129441 A1 | 5/2012 | Peng et al. | |
| 2012/0285096 A1 | 11/2012 | Green | |
| 2013/0029584 A1* | 1/2013 | Chan | H05K 7/20145 454/367 |
| 2015/0145391 A1 | 5/2015 | Broome et al. | |
| 2015/0305202 A1* | 10/2015 | Veino | H05K 7/20709 361/679.46 |

OTHER PUBLICATIONS

Cox, et al., "Collapsible Enclosure Cover for Facilitating Air Flow for an Enclosure," Accelerated Examination Request, U.S. Appl. No. 14/974,284, filed Dec. 18, 2015.

List of IBM Patents or Patent Applications Treated as Related, signed Dec. 18, 2015, 2 pgs.

Alhof, "19 Data Racks", AlHof.com, Product Catalog, © 2007 AlHof S.p.A. http://www.alhof.com/cataloghi/cat_p021_f17.pdf.

Compaq, "Compaq Rack 9000 Series", pp. 1-5. ftp://ftp.compaq.com/pub/products/storageworks/options/Rack9000dt.pdf.

Niemann, "Hot Aisle vs. Cold Aisle Containment", White Paper #135, APC, pp. 1-13, © 2008 American Power Conversion. http://www.apcdistributors.com/white-papers/Cooling/WP-135%20Hot%20Aisle%20vs.%20Cold%20Aisle%20Containment.pdf.

Panduit, "Net-Access™ Server Cabinets—32"×40"", Panduit ® Specification Sheet, Aug. 2011, © 2011 Panduit Corp. http://www.panduit.com/heiler/SpecificationSheets/WW-RKSP63%20Net-Access%20Server%20Cabinet%20WEB%208-8-11.pdf.

U.S. Appl. No. 14/277,900, filed May 15, 2014.

U.S. Appl. No. 14/974,284, filed Dec. 18, 2015.

\* cited by examiner

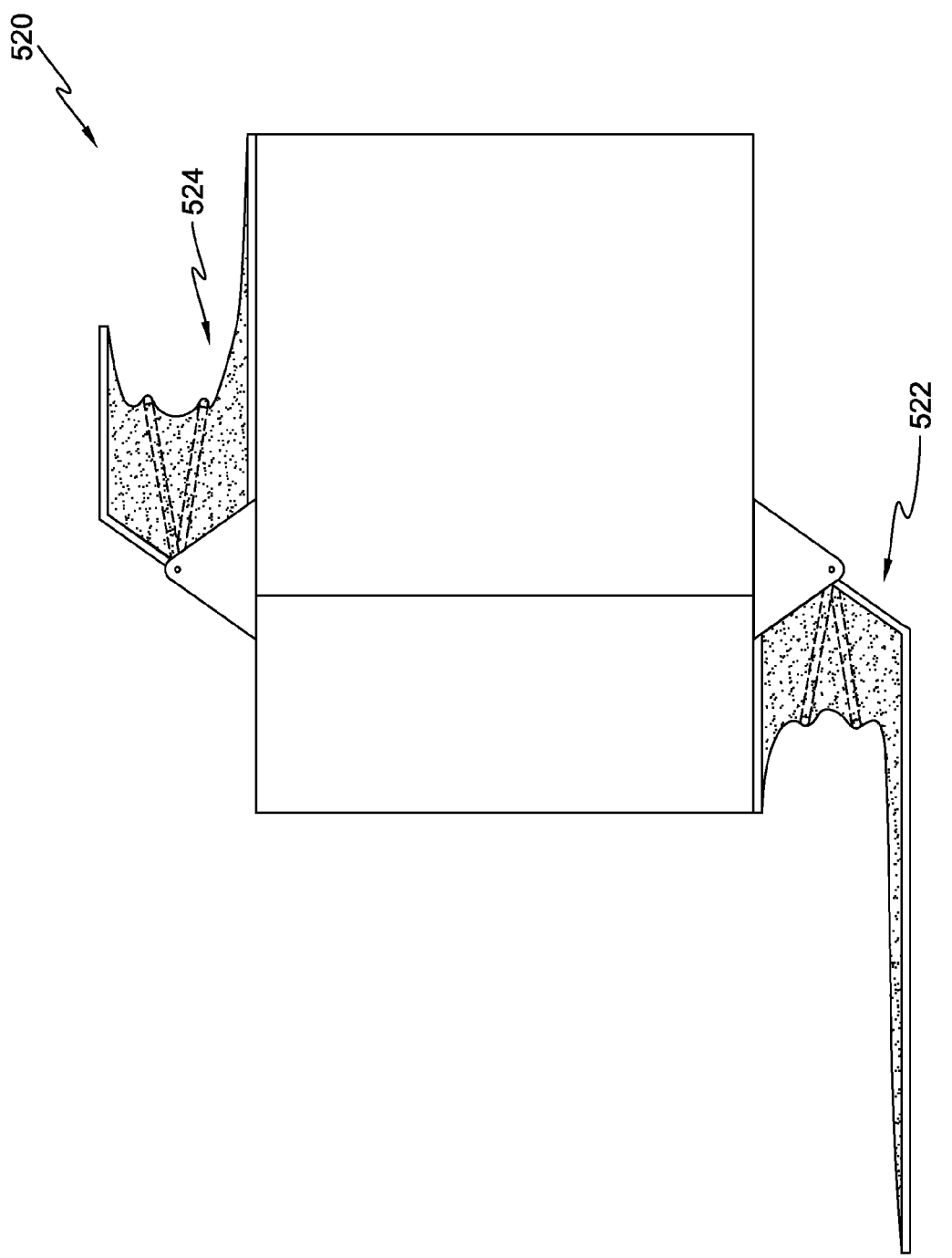

COLLAPSIBLE ENCLOSURE COVER FOR FACILITATING AIR FLOW FOR AN ENCLOSURE

BACKGROUND

The present disclosure relates to cooling data center equipment, and more specifically to a collapsible cover configured to attach to an electronic module enclosure to facilitate the directing of warm air flow from an electronic module to a cooling system and cool air flow from the cooling system to the electronic module. Cooling needs for enterprise data center equipment are increasing as equipment performance increases. Cooling efficiency in data centers translates into electricity cost savings, while reducing the environmental footprint of a data center. There is increased industry attention to data center infrastructure technologies that minimize electricity consumption.

SUMMARY

According to embodiments of the present disclosure, a collapsible enclosure cover for facilitating air flow for an enclosure having at least one module storage location and at least one cooling system storage location. In various embodiments, the cover can include a collapsible frame including a first guide rail. The first guide rail can include a first mounting bracket having a first end designed to attach to a top of an opening of the enclosure and having a second end with a first hole, and a first elongated member having a first end through the first hole. The collapsible frame can also include a second guide rail opposite the first guide rail. The second guide rail can include a second mounting bracket having a first end designed to attach to a bottom of the opening of the enclosure and having a second end with a second hole, and a second elongated member having a first end through the second hole and extending toward the first guide rail and having a same axis as the first elongated member. The collapsible frame can further include a plurality of poles extending from the first guide rail to the second guide rail, having first ends attached to the first elongated member and designed to swivel around the first elongated member and having second ends attached to the second elongated member and designed to swivel around the second elongated member. Furthermore, the cover can include a fabric portion connected to and disposed over the plurality of poles and, when in the installed position, designed to guide air to move between the at least one module storage location and the at least one cooling system storage location.

According to embodiments of the present disclosure, a system for facilitating air flow. In various embodiments, the system can include an enclosure including at least one module storage location, and at least one cooling system storage location. The system can also include a collapsible frame including a first guide rail. The first guide rail can include a first mounting bracket having a first end designed to attach to a top of an opening of the enclosure and having a second end with a first hole, and a first elongated member having a first end through the first hole. The collapsible frame can also include a second guide rail opposite the first guide rail. The second guide rail can include a second mounting bracket having a first end designed to attach to a bottom of the opening of the enclosure and having a second end with a second hole, and a second elongated member having a first end through the second hole and extending toward the first guide rail and having a same axis as the first elongated member. The collapsible frame can further include a plurality of poles extending from the first guide rail to the second guide rail, having first ends attached to the first elongated member and designed to swivel around the first elongated member and having second ends attached to the second elongated member and designed to swivel around the second elongated member. Furthermore, the system can include a fabric portion connected to and disposed over the plurality of poles and, when in the installed position, designed to guide air to move between the at least one module storage location and the at least one cooling system storage location.

The above summary is not intended to describe each illustrated embodiment or every implementation of the present disclosure.

BRIEF DESCRIPTION OF THE DRAWINGS

The drawings included in the present application are incorporated into, and form part of, the specification. They illustrate embodiments of the present disclosure and, along with the description, serve to explain the principles of the disclosure. The drawings are only illustrative of certain embodiments and do not limit the disclosure.

FIG. 5B depicts a top view example of two, partially collapsed, covers attached to the front and back of an electronic module enclosure, consistent with embodiments of the present disclosure.

Figure 1:
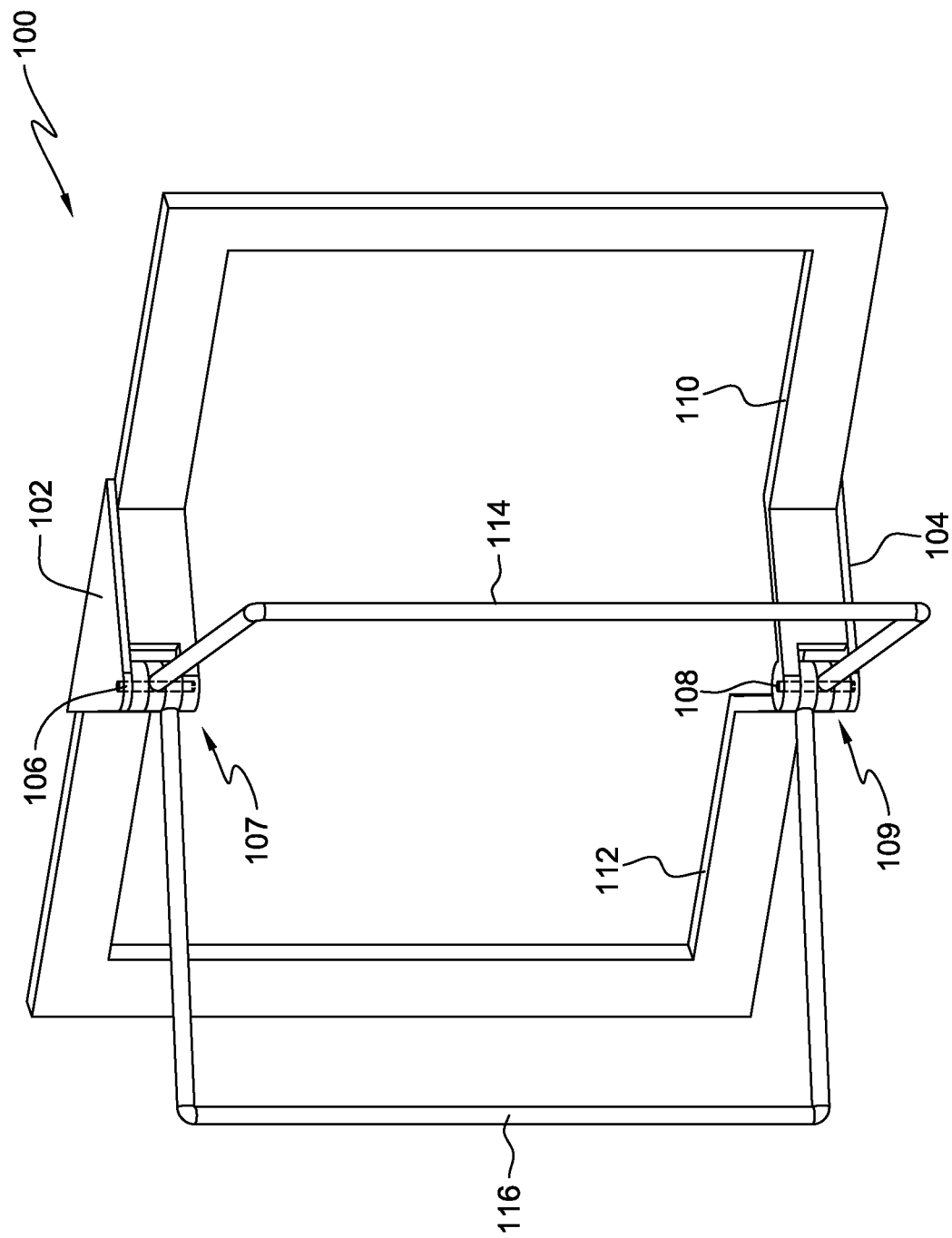
FIG. 1 depicts an unattached collapsible frame, consistent with embodiments of the present disclosure.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention.

DETAILED DESCRIPTION

Aspects of the present disclosure relate to cooling data center equipment, more particular aspects relate to a collapsible cover configured to attach to an electronic module enclosure to facilitate the directing of warm air from an electronic module to a cooling system and cool air from the cooling system to the electronic module. While the present disclosure is not necessarily limited to such applications, various aspects of the disclosure may be appreciated through a discussion of various examples using this context.

Various embodiments of the present disclosure are directed toward a collapsible cover that is designed for use with an electronic module enclosure. The cover can be designed with a collapsible frame and a flexible, air tight, fabric connected and disposed over the collapsible frame. In addition, the cover can be designed to attach to the electronic module enclosure and open, exposing only an electronic module compartment, or exposing only a cooling system compartment, or both. This can allow for access to the electronic module and the cooling system so they can be serviced, adjusted, replaced, etc. Furthermore, the cover can be designed to hinge 180 degrees and avoid creating an obstacle, especially when the electronic module enclosure is located in small or tight areas where space is scarce.

Certain embodiments are also directed toward a collapsible cover that is designed to collapse when not in use. This can be useful for ease of storage and transport. For instance, if servers are being stored in a data center and a new server has been placed in the data center, multiple covers can also be stored in the data center and are readily available whenever needed. Furthermore, the cover can be designed to be lighter than regular electronic module enclosure doors, therefore, decreasing the total weight of the electronic module enclosure.

Turning now to the figures, FIG. 1 depicts an unattached collapsible frame 100, consistent with embodiments of the present disclosure. The collapsible frame can include mounting poles 110 and 112 and subsidiary poles 114 and 116 (collectively, poles). The mounting poles 110 and 112 can be designed to fit snugly and adjacently to a perimeter of the opening of the electronic module enclosure (not depicted). The adjacency of the mounting poles 110 and 112 prevent air, flowing out of the opening, from escaping through cracks between the mounting poles and the electronic module enclosure. The mounting poles 110 and 112 can be substantially flattened to further prevent the escape of air and to interface with the electronic module enclosure. Furthermore, mounting poles 110, 112 can be sturdy enough to support the weight of the collapsible cover, preventing the collapsible cover from pulling away from the electronic module enclosure and allowing air to escape. Mounting pole 110 can be a first length and mounting pole 112 can be a second length. Mounting pole 110 can include a first pair of angular bends. Mounting pole 112 can include a second pair of angular bends. The first pair and second pair forming a raised central section. The poles 110, 112, 114, and 116 can be designed to prevent a flexible fabric (not depicted) that is connected to and disposed over the poles from collapsing inward or bulging outward excessively.

Collapsible frame 100 can also include mounting brackets 102 and 104. Mounting brackets 102 and 104 can be designed to further attach the collapsible frame to the electronic module enclosure. Mounting brackets 102 and 104 can increase stability between the collapsible frame 100 and the electronic module enclosure. This stability prevents air, flowing out of the opening, from escaping through cracks between the collapsible frame and the electronic module enclosure. Mounting brackets 102 and 104 can interface with mounting poles 110 and 112 substantially adjacent to the raised central section, further preventing the escape of air between the collapsible frame and the electronic module enclosure. As shown, mounting brackets 102 and 104 and the ends of poles 110, 112, 114, and 116 can be attached together with elongated members 106 and 108. The raised central section may extend away from the electronic module enclosure to separate elongated members 106 and 108 a distance from the electronic module enclosure. The combination of the mounting brackets and elongated members can create guide rails 107 and 109 that allow the poles to swivel around the elongated members and allow the poles to unfold and cover a module storage location and a cooling system storage location of the electronic module enclosure. By swiveling around the elongated members, the poles can fold and unfold, thus creating the collapsibility of the collapsible frame 100. Furthermore, with this collapsibility capability, the poles can extend to cover an opening of an electronic module storage location and an opening of a cooling system storage location of the electronic module enclosure. The module storage location and cooling system storage location can be different sizes, and the first length of mounting pole 110 and the second length of mounting pole 112 can correspond to the different sizes.

Figure 2:
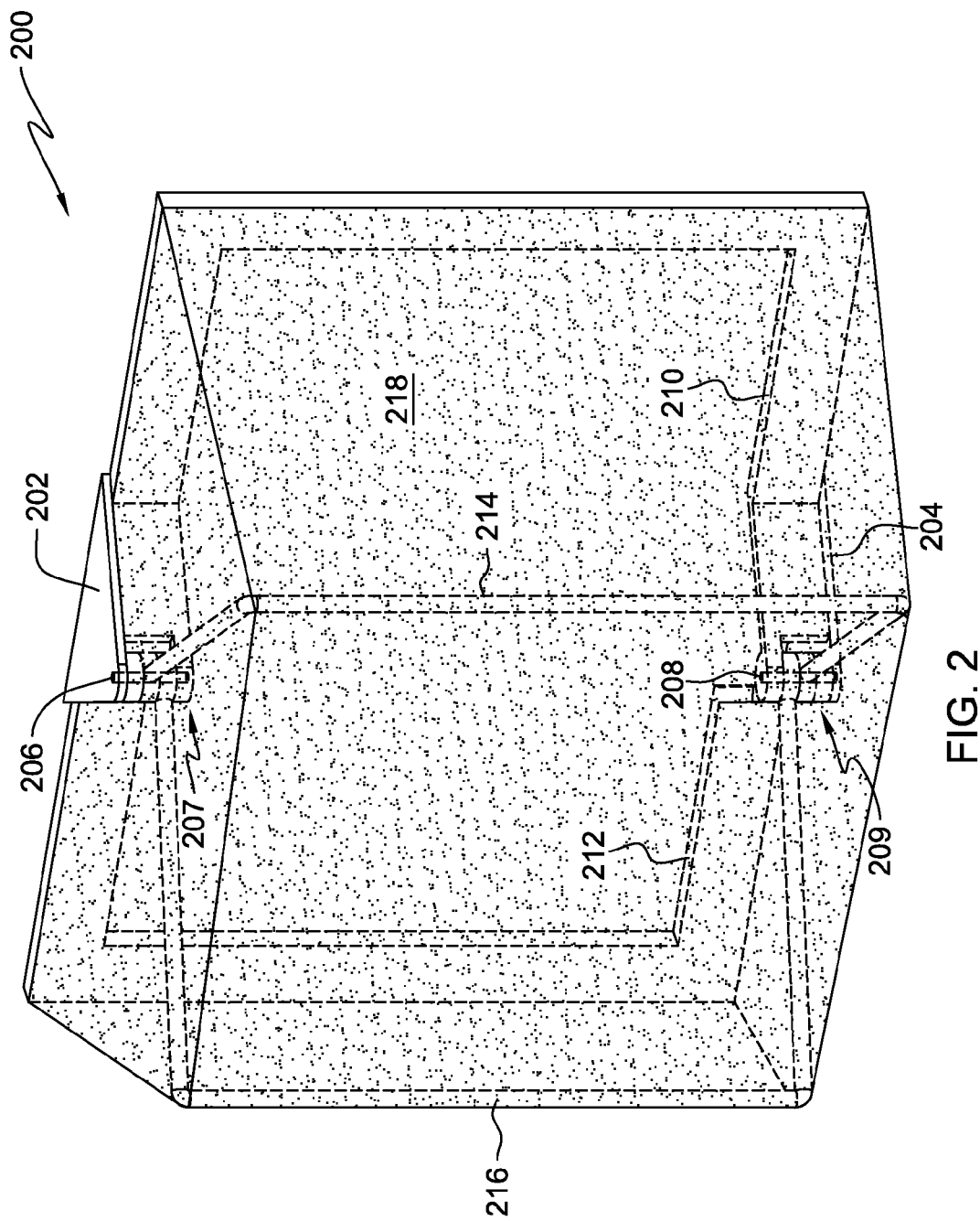
FIG. 2 depicts an unattached collapsible cover, consistent with embodiments of the present disclosure.

FIG. 2 depicts an unattached collapsible cover 200, consistent with embodiments of the present disclosure. The collapsible cover 200 can include poles 210, 212, 214, and 216, mounting brackets 202 and 204 and elongated members 206 and 208. The mounting brackets 202 and elongated member 206 make up guide rail 207 and mounting bracket 204 and elongated member 208 make up guide rail 209. The parts can be assembled and configured into a collapsible frame that operates in relatively the same manner as discussed above for the collapsible frame 100, from FIG. 1. As shown, the collapsible cover 200 can also include a flexible fabric 218 connected to and disposed over the collapsible frame. The flexible fabric 218 can be designed so that air can not substantially penetrate through the flexible fabric and can be composed of many materials, such as nylon, vinyl, and canvas. The flexible fabric can also be cut in a shape and size that closely conforms to one or more surfaces defined by the collapsible frame. Also, the flexible fabric can be cut so that the top and bottom horizontal portions of the collapsible frame are covered by the flexible fabric. Furthermore, if necessary, the collapsible cover 200 can be coated with a metallic material, such as aluminum, copper, or tin to fulfill electromagnetic control (EMC) or electrostatic discharge (ESD) requirements.

Figure 3:
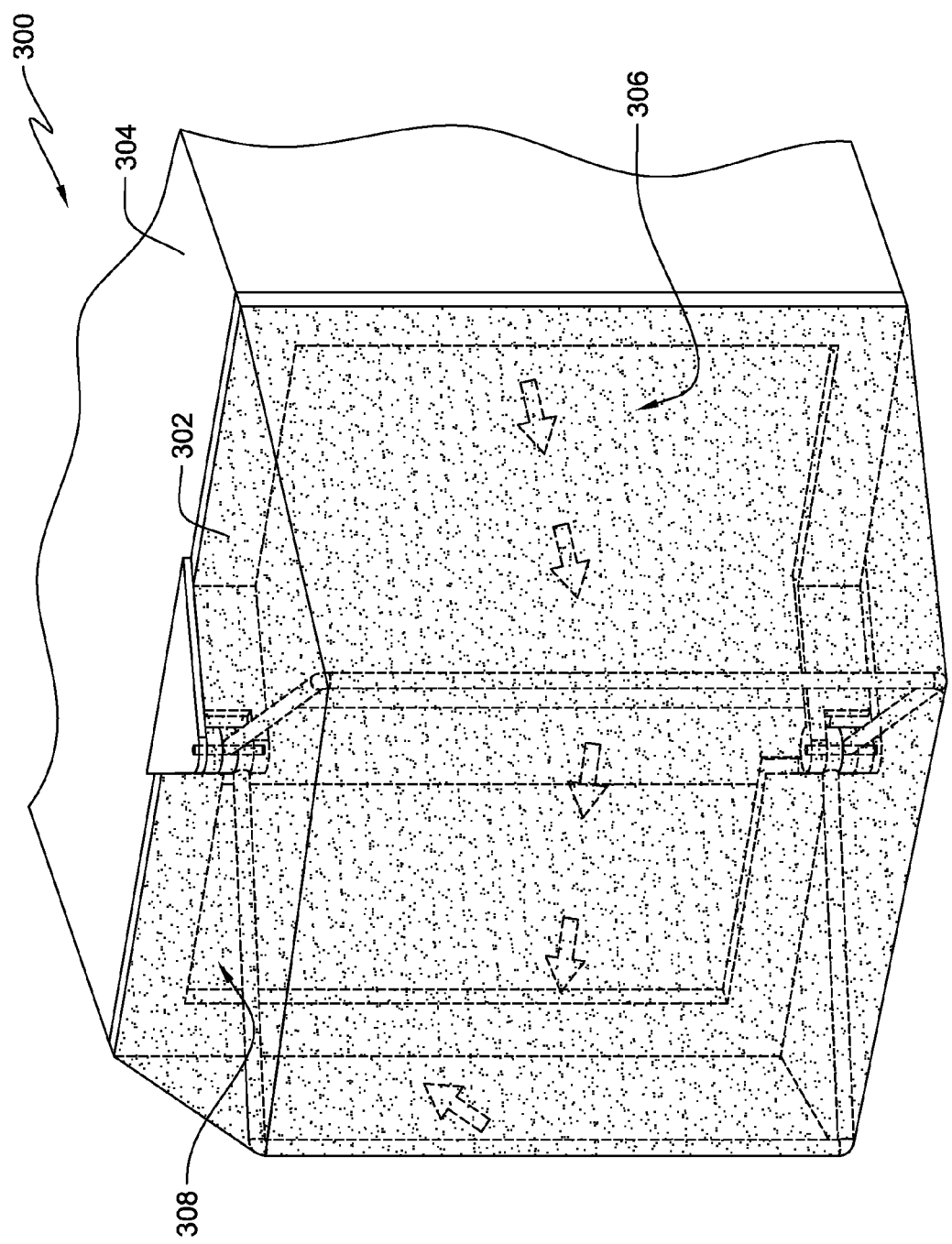
FIG. 3 depicts an example of a collapsible cover attached to an electronic module enclosure, consistent with embodiments of the present disclosure.

FIG. 3 depicts an example 300 of a collapsible cover attached to an electronic module enclosure, consistent with embodiments of the present disclosure. The collapsible cover 302 can be configured in relatively the same manner as discussed above for the collapsible cover 200, from FIG. 2. As shown, the electronic module enclosure 304 can include a module storage location 306 and a cooling system storage location 308.

The collapsible cover 302 can be designed to fit snugly on the front or back of the electronic module enclosure 304 (not shown fitted on the back in FIG. 3). For example, the collapsible cover can be attached to the electronic module enclosure by snaps, clips, clamps, hooks, clasps, flanges, magnets, pins, fasteners, straps, ties, etc. Also, the collapsible cover can be installed on the electronic module enclosure such that the collapsible cover remains in a substantially static position relative to at least a portion of the electronic module enclosure. For example, the collapsible cover can be secured to the electronic module enclosure by attaching poles, e.g. poles 210 and 212 from FIG. 2, around a perimeter of the electronic module enclosure. In addition, poles, e.g. poles 210, 212, 214, and 216 from FIG. 2, can be bent to create a pathway between the electronic module enclosure opening and the flexible fabric, e.g. flexible fabric 218 from FIG. 2, so air can move along the pathway between the module storage location 306 and the cooling system storage location 308. Furthermore, the collapsible cover can have guiding rails, e.g. guiding rails 207 and 209, that are attached to the top and bottom of the opening of the electronic module enclosure.

In such a configuration, the collapsible cover 302 can guide the air that propagates from an electronic module (not shown) located in the module storage location 306 to a cooling system (not shown) located in the cooling system storage location 308 or vice versa. For example, the arrows in FIG. 3 are shown to represent the path of warm air coming out of the module storage location 306. As illustrated, the warm air moves out of the front of the module storage location and is guided by the collapsible cover around a boundary between the module storage location and the cooling system storage location. The warm air is then further guided by the collapsible cover into the front of the cooling system storage location 308 where a cooling system can cool the warm air.

The cooled air can then travel out the back of the cooling system storage location 308 where another collapsible cover (not shown) can be located to guide the cool air into the back of the module storage location 306, where the cycle can be repeated. However, this is only an example and the cooled air can reenter the module storage location 306 by other means. For instance, there can be a gap in the boundary between the module storage location 306 and the cooling system storage location 308 and the cooled air can travel through the gap into the module storage location 306. In addition, the collapsible cover 302 can be used exclusively to guide cooled air from the cooling system storage location 308 to the module storage location 306 and the warm air can reenter the cooling system storage location through a gap in the boundary between the module storage location and the cooling system storage location. Furthermore, the collapsible cover can be used exclusively to redirect cool air and warm air can be released out the front or back of the electronic module enclosure 304 and not be recycled through the cooling system.

Figure 4B:
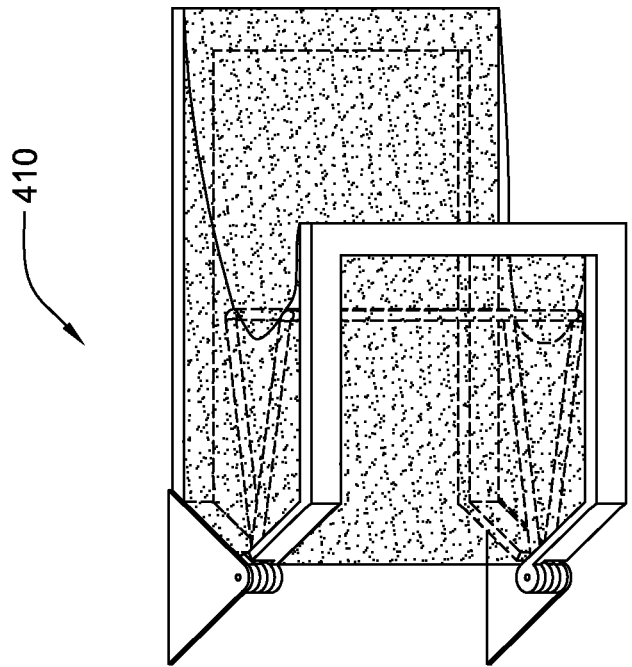
FIG. 4B depicts a second example of an unattached, partially collapsed, cover, consistent with embodiments of the present disclosure.
Figure 4A:
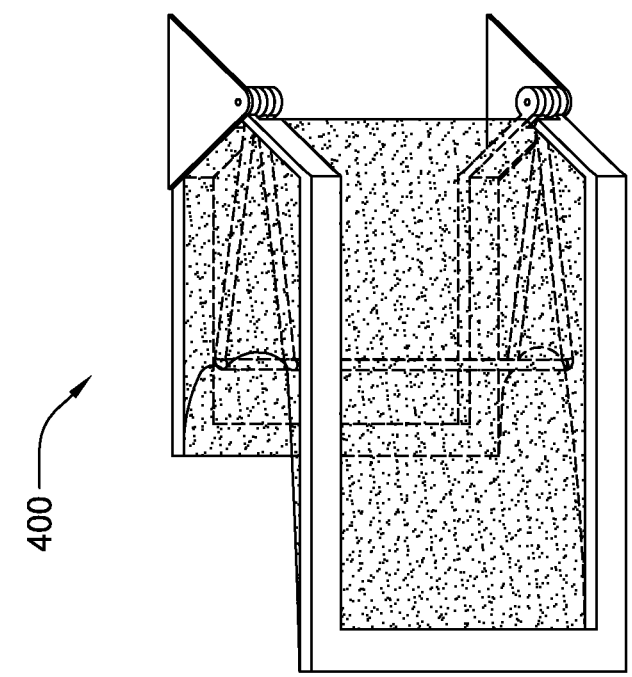
FIG. 4A depicts a first example of an unattached, partially collapsed, cover, consistent with embodiments of the present disclosure.

FIG. 4A depicts a first example of an unattached, partially collapsed, cover 400, consistent with embodiments of the present disclosure. The collapsible cover 400 can be configured in relatively the same manner as discussed above for the collapsible cover 200, from FIG. 2. As shown, the collapsible cover 400 can hinge at elongated members where the ends of the poles, e.g. poles 110 and 112 from FIG. 1, are attached. This can enable the poles of collapsible cover 400 to fold, opening the collapsible cover, and allowing access to strictly an electronic module located in a module storage location, e.g. module storage location 306 from FIG. 3, while a cooling system storage location, e.g. cooling system storage location 308 from FIG. 3, remains covered by a portion of the collapsible cover. Furthermore, when unattached, FIG. 4A depicts the poles folded up, allowing the collapsibility of the cover 400 and creating ease of storage and transport.

FIG. 4B depicts a second example of an unattached, partially collapsed, cover 410, consistent with embodiments of the present disclosure. The collapsible cover 410 can be configured in relatively the same manner as discussed above for the collapsible cover 200, from FIG. 2. As shown, the collapsible cover 410 can hinge at elongated members where the ends of the poles, e.g. poles 110 and 112 from FIG. 1, are attached. This can enable the poles of collapsible cover 410 to fold, opening the collapsible cover 410, and allowing access to strictly a cooling system located in a cooling system storage location, e.g. cooling system storage location 308 from FIG. 3, while a module storage location, e.g. module storage location 306 from FIG. 3, remains covered by a portion of the collapsible cover. Furthermore, when unattached, FIG. 4B depicts the poles folded up, allowing the collapsibility of the cover 410 and creating ease of storage and transport.

Figure 5A:
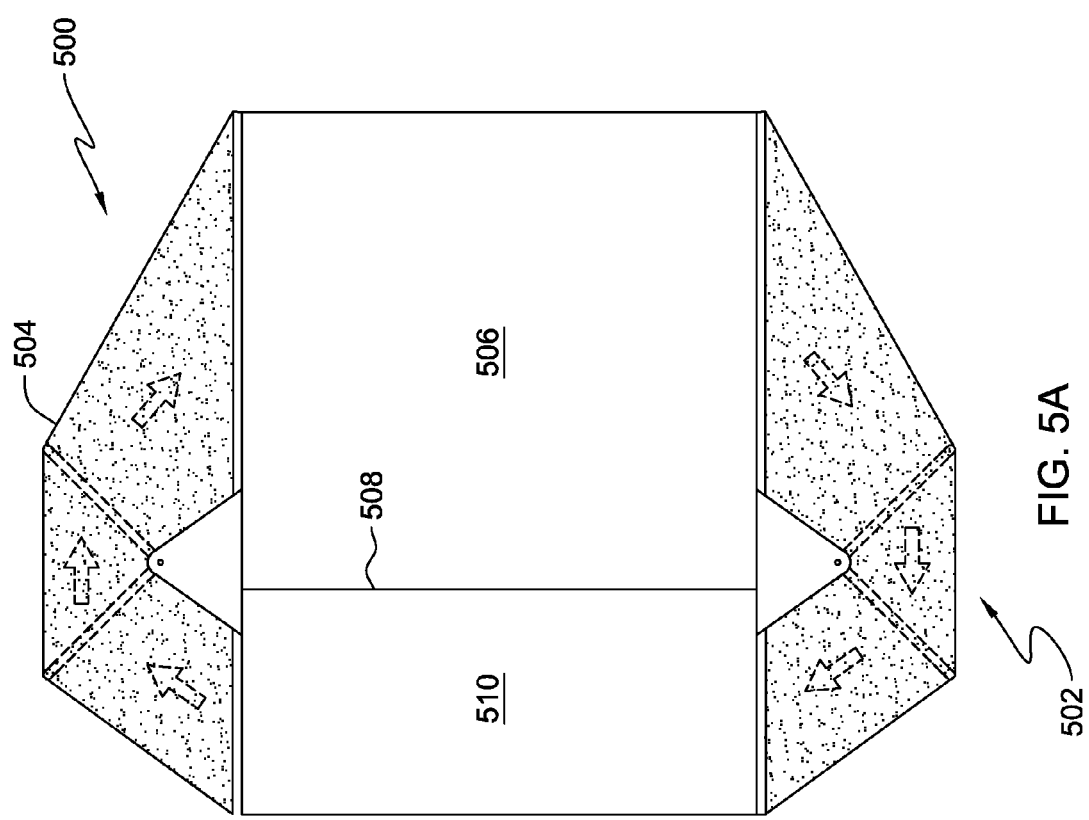
FIG. 5A depicts a top view example of two collapsible covers attached to the front and back of an electronic module enclosure, consistent with embodiments of the present disclosure.

FIG. 5A depicts a top view example 500 of two collapsible covers attached to the front and back of an electronic module enclosure, consistent with embodiments of the present disclosure. The collapsible covers 502 and 504 can be configured in relatively the same manner as discussed above for the collapsible cover 200, from FIG. 2. As shown, the arrows represent the path of warm air coming out of a module storage location 506. The warm air moves out of module storage location and is guided by the collapsible cover 502 around a boundary 508 between the module storage location 506 and a cooling system storage location 510. The warm air is then further guided by the collapsible cover 502 into the cooling system storage location 510 where a cooling system (not shown) can cool the warm air. The cooled air can then travel out the back of the cooling system storage location where the collapsible cover 504 is located to guide the cool air back into the module storage location 506 and the cycle is repeated.

FIG. 5B depicts a top view example 520 of two, partially collapsed, covers attached to the front and back of an electronic module enclosure, consistent with embodiments of the present disclosure. The collapsible covers 522 and 524 can be configured in relatively the same manner as discussed above for the collapsible cover 200, from FIG. 2. As shown, the collapsible enclosure cover 524 can open, exposing a cooling system storage location with a pole still attached to a part of the perimeter of the opening of the enclosure and still covering a module storage location. Furthermore, the collapsible cover 522 can open, exposing the module storage location with a pole still attached to a part of the perimeter of the opening of the enclosure and still covering the cooling system storage location.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to explain the principles of the embodiments, the practical application or technical improvement over technologies found in the marketplace, or to enable others of ordinary skill in the art to understand the embodiments disclosed herein.

What is claimed is:
1. A system for facilitating air flow, the system comprising:
    an electronic enclosure including:
        at least one module storage location, and
        at least one cooling system storage location;
    a first collapsible frame including:
        a first mounting bracket having a first end designed to attach to a top of an opening of the electronic enclosure and having a second end with a first hole,
        a first elongated member having a first end through the first hole,
        a second mounting bracket, opposite the first mounting bracket, having a first end designed to attach to a bottom of the opening of the electronic enclosure and having a second end with a second hole,
        a second elongated member having a first end through the second hole and extending toward the first mounting bracket and having a same axis as the first elongated member, and a first plurality of poles extending from the first mounting bracket to the second mounting bracket, having first ends attached to the first elongated member and designed to swivel around the first elongated member and having second ends attached to the second elongated member and designed to swivel around the second elongated member;

a second collapsible frame, the second collapsible frame on the opposite side of the enclosure from the first collapsible frame, including:

a third mounting bracket having a first end designed to attach to a top of a second opening of the enclosure and having a second end with a third hole, and a third elongated member having a first end through the third hole, a fourth mounting bracket, opposite the third mounting bracket, having a first end designed to attach to a bottom of the second opening of the enclosure and having a second end with a fourth hole, a fourth elongated member having a first end through the fourth hole and extending toward the third mounting bracket and having a same axis as the third elongated member, and a second plurality of poles extending from the third mounting bracket to the fourth mounting bracket, having first ends attached to the third elongated member and designed to swivel around the third elongated member and having second ends attached to the fourth elongated member and designed to swivel around the fourth elongated member;

a fabric portion connected to and disposed over the first plurality of poles and, when in the installed position, designed to guide air to move between the at least one module storage location and the at least one cooling system storage location; and a second fabric portion connected to and disposed over the second plurality of poles and, when in the installed position, designed to guide air to move between the at least one cooling system storage location and the at least one module storage location.

2. The system of claim 1, wherein the first plurality of poles includes:

at least two poles, when in the installed position, designed to fit adjacently to a perimeter of the opening of the electronic enclosure such that the air can not substantially escape through cracks between the at least two poles and the electronic enclosure and further designed to support the first collapsible frame such that the first collapsible frame can not pull away from the electronic enclosure; and a set of bent poles, when in the installed position, designed to create a pathway, between the enclosure and the fabric portion, for the air to move between the at least one module storage location and the at least one cooling system storage location and further designed to prevent the fabric portion from collapsing inward or bulging outward excessively.

3. The system of claim 1, wherein the first collapsible frame can open, exposing the at least one cooling system storage location with a first pole from the first plurality of poles attached to a first part of a perimeter of the opening of the electronic enclosure and can further open, exposing the at least one module storage location with a second pole from the first plurality of poles attached to a second part of the perimeter of the opening of the electronic enclosure.

4. The system of claim 1, wherein the fabric portion is air tight and designed to stop air from flowing through the first collapsible frame.

5. The system of claim 1, wherein the fabric portion is coated with a metallic material to fulfill electromagnetic control and electrostatic discharge requirements.

6. The system of claim 1, wherein the fabric portion is in a shape and size that substantially conforms to one or more surfaces defined by the first collapsible frame.

7. The system of claim 1, wherein the first collapsible frame hinges at least 180 degrees.

8. The system of claim 1, wherein, when in the installed position, warm air is guided via the first collapsible frame from the at least one module storage location to the at least one cooling system storage location and cool air is guided via the second collapsible frame from the at least one cooling system storage location to the at least one module storage location.

9. The system of claim 1, wherein the first collapsible frame attaches to the enclosure using a magnet.

* * * * *